United States Patent
Shin et al.

(10) Patent No.: US 8,576,654 B2
(45) Date of Patent: Nov. 5, 2013

(54) NON-VOLATILE MEMORY DEVICE HAVING PHASE-CHANGE MATERIAL AND METHOD FOR FABRICATING THE SAME

(75) Inventors: Yong-shik Shin, Hwaseong-si (KR); Ji-won Jung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 59 days.

(21) Appl. No.: 13/414,014

(22) Filed: Mar. 7, 2012

(65) Prior Publication Data

US 2012/0314492 A1 Dec. 13, 2012

(30) Foreign Application Priority Data

Jun. 13, 2011 (KR) .......................... 10-2011-0057001

(51) Int. Cl.
*G11C 17/18* (2006.01)
(52) U.S. Cl.
CPC ...................................... *G11C 17/18* (2013.01)
USPC .......... 365/225.7; 365/96; 365/148; 365/100; 365/230.03
(58) Field of Classification Search
USPC ................... 365/225.7, 96, 148, 100, 230.03
See application file for complete search history.

(56) References Cited

U.S. PATENT DOCUMENTS

2009/0262574 A1* 10/2009 Hanzawa et al. ............ 365/163
2010/0118579 A1 5/2010 Liu et al.

FOREIGN PATENT DOCUMENTS

| KR | 1020080044792 A | 5/2008 |
| KR | 1020090107322 A | 10/2009 |
| KR | 1020090111784 A | 10/2009 |

* cited by examiner

*Primary Examiner* — Thong Q Le
(74) *Attorney, Agent, or Firm* — Myers Bigel Sibley & Sajovec, P.A.

(57) ABSTRACT

A non-volatile memory device includes a plurality of memory blocks. Each of memory blocks includes a main area including a plurality of first memory cells having a phase-change material and a spare area including at least one second memory cell for storing initial information about the plurality of first memory cells. In the non-volatile memory device, a circuit of the at least one second memory cell is cut off according to the initial information, and the initial information is defective block information that is information about a defect of the plurality of memory blocks.

11 Claims, 12 Drawing Sheets

NON-VOLATILE MEMORY DEVICE HAVING PHASE-CHANGE MATERIAL AND METHOD FOR FABRICATING THE SAME

CROSS-REFERENCE TO RELATED APPLICATIONS

This application claims the benefit of Korean Patent Application No. 10-2011-0057001, filed on Jun. 13, 2011, in the Korean Intellectual Property Office, the disclosure of which is incorporated herein in its entirety by reference

BACKGROUND

The inventive concept relates to a non-volatile memory device having a phase-change material and a method for fabricating the same, and more particularly, to the non-volatile memory device adopting a method of storing an initial defective block in the non-volatile memory device, and the method for fabricating the same.

Recently, phase-change memory devices, including a phase-change material, have been suggested as a replacement for flash memory devices. A phase-change material is changed to an amorphous state having a high resistance when heated to a temperature higher than a melting temperature and then cooled down, or to a crystalline state having a low resistance when heated to a temperature lower than a melting temperature and higher than a crystallization temperature and then cooled down. Accordingly, whether information stored in a memory cell including the phase-change material is logic "1" or logic "0" may be determined by detecting current flowing through the phase-change material in a read mode. Initial information is stored in a non-volatile memory device before the non-volatile memory device is shipped as a product. The initial information may be lost due to a characteristic of a phase-change material by a high temperature process such as a reflow process.

SUMMARY

The inventive concept provides a non-volatile memory device adopting a method of preventing initial information stored in a non-volatile memory device including a phase-change material from being lost even in a high temperature environment.

The inventive concept provides a method for fabricating a non-volatile memory device adopting a method of preventing initial information stored in a non-volatile memory device including a phase-change material from being lost even in a high temperature environment.

According to an aspect of the inventive concept, there is provided a non-volatile memory device, which includes a plurality of memory blocks, each including a main area including a plurality of first memory cells having a phase-change material and a spare area including at least one second memory cell for storing initial information about the plurality of first memory cells, wherein a circuit of the at least one second memory cell is cut off according to the initial information, and the initial information is defective block information that is information about a defect of the plurality of memory blocks.

In a read operation, the at least one second memory cell may be unchangedly read as the same logic value.

The at least one second memory cell may include a phase-change element connected to a bit line, a switching element opening and closing a connection between the phase-change element and ground according to a signal applied via a word line, and a fuse layer that is opened by an electromagnetic wave, wherein the fuse layer is arranged between the bit line and the phase-change element, between the phase-change element and the switching element, or between the switching element and the ground.

The at least one second memory cell may be provided in plural and each second memory cell may include a phase-change element connected to a bit line and a transistor element that opens and closes a connection between the phase-change element and ground according to a signal applied via a word line, and the word line that is commonly connected to gates of the plurality of transistor elements may be floated by cutting when a block including the plurality of second memory cells is defective.

The at least one second memory cell may include a phase-change element and a diode element serially connected between a bit line and a word line, and a fuse layer that is opened by an electromagnetic wave and arranged between the bit line and the phase-change element or between the phase-change element and the diode element.

The at least one second memory cell may be provided in plural and each second memory cell may include a phase-change element and a diode element that are serially connected to a bit line and a word line, and the word line that is commonly connected to gates of the plurality of diode elements may be floated by cutting when a block including the plurality of second memory cells is defective.

The at least one second memory cell may include a contact plug arranged on a substrate, a fuse layer arranged on the contact plug, a lower electrode arranged on the fuse layer, a phase-change material layer arranged on the lower electrode, and an upper electrode arranged on the phase-change material layer.

The lower electrode may have a cross-section of a trapezoid having a lower side shorter than an upper side.

The at least one second memory cell may include a ground contact plug arranged on a substrate, and a fuse layer arranged on the ground contact plug, wherein the ground contact plug is connected to ground via the fuse layer.

The at least one second memory cell may include a contact plug arranged on a substrate, a lower electrode arranged on the contact plug, a phase-change material layer arranged on the lower electrode, an upper electrode arranged on the phase-change material layer, and a fuse layer arranged on the upper electrode.

The at least one second memory cell may include a word line arranged on a substrate, an n-type semiconductor layer arranged on the word line, a p-type semiconductor layer arranged on the n-type semiconductor layer, a contact plug arranged on the p-type semiconductor layer, a fuse layer arranged on the contact plug, a lower electrode arranged on the fuse layer, a phase-change material layer arranged on the lower electrode, and an upper electrode arranged on the phase-change material layer.

The at least one second memory cell may include a word line arranged on a substrate, an n-type semiconductor layer arranged on the word line, a p-type semiconductor layer arranged on the n-type semiconductor layer, a contact plug arranged on the p-type semiconductor layer, a lower electrode arranged on the contact plug, a phase-change material layer arranged on the lower electrode, an upper electrode arranged on the phase-change material layer, and a fuse layer arranged on the upper electrode.

The at least one second memory cell may include a contact plug arranged on a substrate, a fuse layer arranged on the contact plug, a lower electrode arranged on the fuse layer, a phase-change material layer arranged on the lower electrode, and an upper electrode arranged on the phase-change material layer.

The fuse layer may be opened at a temperature higher than a melting temperature of the phase-change material layer. Also, an area where the lower electrode contacts the fuse layer may be smaller than an area where the lower electrode contacts the phase-change material layer.

According to another aspect of the inventive concept, there is provided a method for fabricating a non-volatile memory device including a main area including a plurality of first memory cells having a phase-change material and a spare area including at least one second memory cell, the method including testing the main area of the non-volatile memory device and storing information about a defect of the main area in the spare area by cutting off a circuit of the at least one second memory cell according to the information about a defect of the main area.

In the testing of the main area, information about an address of a defective block to which a defective bit of the main area belongs may be generated, and the storing of information about a defect of the main area may include determining a location of the at least one second memory cell of the spare area where the information about an address of a defective block is stored, and opening a connection between lines to which the at least one second memory cell is connected, by irradiating an electromagnetic wave to the at least one second memory cell.

The method may further include mounting the non-volatile memory device on a substrate by a reflow process, to fabricate a non-volatile memory module.

In the storing of the information about a defect in the spare area, the fuse layer may be opened by applying a voltage higher than a phase-change voltage of the first memory cell to the at least one second memory cell according to the information about a defect.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
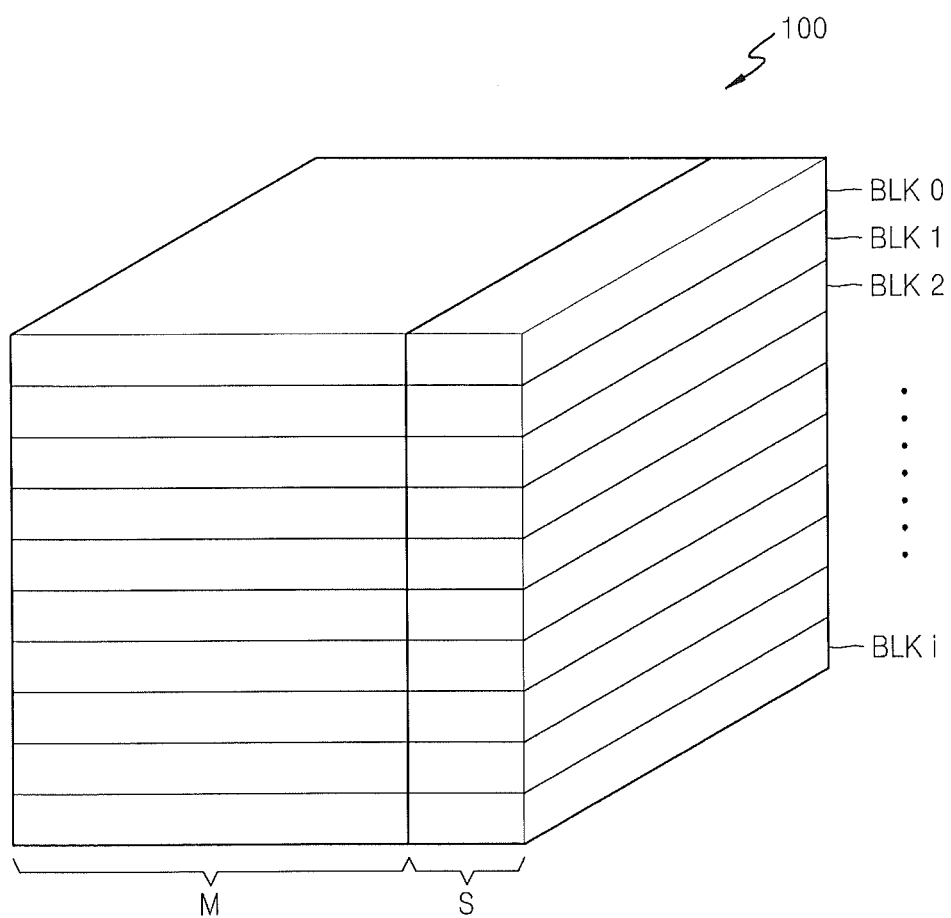
FIG. 1 is a perspective view schematically illustrating a storage space of a non-volatile memory device including a phase-change material, according to an exemplary embodiment of the present inventive concept.

Exemplary embodiments are provided to further completely explain the present inventive concept to one skilled in the art to which the present inventive concept pertains. However, the present inventive concept is not limited thereto and it will be understood that various changes in form and details may be made therein without departing from the spirit and scope of the following claims. That is, descriptions on particular structures or functions may be presented merely for explaining exemplary embodiments of the present inventive concept.

In the following description, when a layer is described to exist on another layer, the layer may exist directly on the other layer or a third layer may be interposed therebetween. Also, the thickness or size of each layer illustrated in the drawings is exaggerated for convenience of explanation and clarity. Like references indicate like constituent elements in the drawings. As used in the present specification, the term "and/or" includes any one of listed items and all of at least one combination of the items.

The terms used in the, present specification are used for explaining a specific exemplary embodiment, not limiting the present inventive concept. Thus, the expression of singularity in the present specification includes the expression of plurality unless clearly specified otherwise in context. Also, the terms such as "comprise" and/or "comprising" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof In the present specification, the terms such as "first" and "second" are used herein merely to describe a variety of members, parts, areas, layers, and/or portions, but the constituent elements are not limited by the terms. It is obvious that the members, parts, areas, layers, and/or portions are not limited by the terms. The terms are used only for the purpose of distinguishing one constituent element from another constituent element. Thus, without departing from the right scope of the present inventive concept, a first member, part, area, layer, or portion may refer to a second member, part, area, layer, or portion.

Hereinafter, the exemplary embodiments of the present inventive concept are described in detail with reference to the accompanying drawings. In the drawings, the illustrated shapes may be modified according to, for example, manufacturing technology and/or tolerance. Thus, the exemplary embodiment of the present inventive concept may not be construed to be limited to a particular shape of a part described in the present specification and may include a change in the shape generated during manufacturing, for example.

As used herein, the term "and/or" includes any and all combinations of one or more of the associated listed items. Expressions such as "at least one of," when preceding a list of elements, modify the entire list of elements and do not modify the individual elements of the list.

FIG. 1 is a perspective view schematically illustrating a storage space of a non-volatile memory device 100 including a phase-change material, according to an exemplary embodiment of the present inventive concept.

Referring to FIG. 1, the non-volatile memory device 100 may be formed of cells including a phase-change material. The non-volatile memory device 100 may be referred to as a phase-change random access memory (PRAM). The memory cell of the non-volatile memory device 100 may be a phase-change memory (PCM) (or PRAM) that stores data according to a change in resistance of a phase-change material. However, the non-volatile memory device 100 may be connected to an external apparatus via an interface of a conventional NAND flash memory. A non-volatile memory device 100 having an interface of a NAND flash memory and an inner cell that is formed of a PRAM may be referred to as an NdPCM (NdPRAM).

A storage space of the non-volatile memory device 100 may include a plurality of memory blocks BLK0 to BLKi. In the non-volatile memory device 100, the memory blocks BLK0 to BLKi are logically divided into units for data erasure. For example, when a value of any one bit of data information stored in the memory block BLK0 is changed, all the data information stored in the memory block BLK0 is erased and then the memory block BLK0 is reprogrammed by reflecting a changed bit value. Thus, when there is a defect in any one cell in the memory blocks BLK0 to BLKi, the memory block that has a defective cell is labeled as being defective so that the defective memory block may no longer be used.

The storage space of the non-volatile memory device 100 may be divided into a main area M and a spare area S. The main area M is a where a user may freely write or read data. The spare area S is where peripheral information such as information about a defective block, information about wear leveling, and error correction code (ECC) information are stored. A user has restricted access to the spare area S. Each of the memory blocks BLK0 to BLKi of the non-volatile memory device 100 may be divided into the main area M and the spare area S.

Although it is not illustrated in FIG. 1, the memory blocks BLK0 to BLKi may include a plurality of pages (not shown). For example, one of the memory blocks BLK0 to BLKi includes 64 pages. The pages are logically divided as a basic unit for read and write. Each page (not shown) may be divided into the main area M and the spare area S.

When any one memory block BLK is defective, information about a defective block may be stored in the spare area S of a particular page of the memory block. For example, to indicate a defective block, a value other than 0x0000 may be written to the first address of the spare area S of the first page of the defective memory block. The value "0x0000" may indicate that the corresponding memory block is normal.

In another example, to indicate a defective block, the first bit of the spare area S of the first page of the defective memory block may be written as a particular value. For example, when the first bit of the spare area S of the first page of the memory block is logic "0", the memory block may be defective. An area where information about a defective block is stored may be freely chosen from the spare area S in the memory block, and a method of indicating a defective block may be freely determined.

When a memory product is fabricated by combining the non-volatile memory device 100 and a memory chipset, the memory chipset accesses an address to read a value to determine whether a block is normal. If the block is defective, the block is registered as a defective block, and the memory chipset may not write data on the corresponding block.

However, in the process of fabricating the non-volatile memory device 100 into a memory product, the non-volatile memory device 100 may be exposed to a high temperature environment such as reflow. As a result, the address value may be changed to a different value due to the characteristic of a phase-change material.

Figure 2:
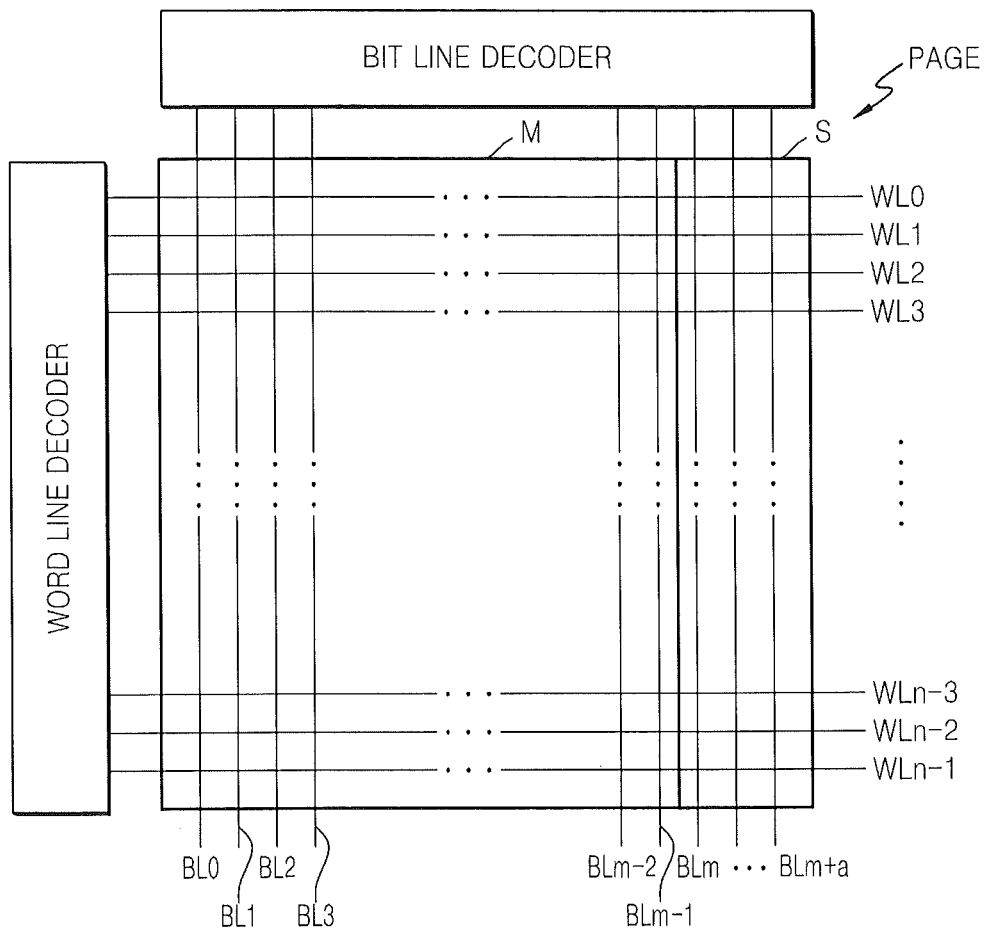
FIG. 2 schematically illustrates a page of a non-volatile memory device including a phase-change material, according to an exemplary embodiment of the present inventive concept.

FIG. 2 schematically illustrates a page PAGE of a non-volatile memory device including a phase-change material, according to an exemplary embodiment of the present inventive concept. Referring to FIG. 2, the page PAGE of the non-volatile memory device 100 includes a plurality of bit lines BL0 to BLm+a and a plurality of word lines WL0 to WLn-1. A memory cell (not shown) is arranged at each point where the bit lines BL0 to BLm+a and the word lines WL0 to WLn-1 meet. The memory cell will be described in detail below.

The page PAGE may be divided into a main area and a spare area. The memory cells that may be accessed by the bit lines BL0 to BLm+a and the word lines WL0 to WLn-1 belong to the main area. Also, the memory cells that may be accessed by the bit lines BLm to BLm+a and the word lines WL0 to WLn-1 belong to the spare area.

Figure 3A:
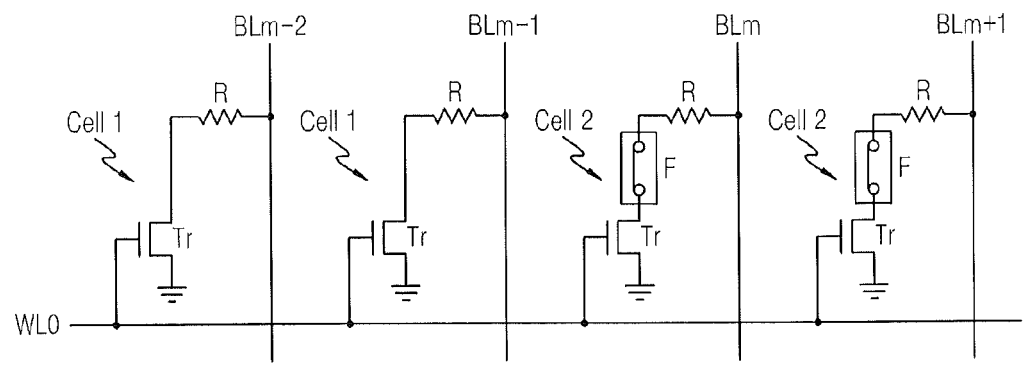
FIG. 3A is a circuit diagram of memory cells forming a part of a non-volatile memory device including a phase-change material, according to an exemplary embodiment of the present inventive concept.

FIG. 3A is a circuit diagram of memory cells forming a part of a non-volatile memory device including a phase-change material, according to an exemplary embodiment of the present inventive concept. Referring to FIG. 3A, one word line WL0 and four bit lines BLm-2 to BLm+1 are illustrated. Memory cells Cell 1 that are connected to the bit lines BLm-2 and BLmp-1 and the word line WL0 may be referred to as first memory cells. Memory cells Cell 2 that are connected to the bit lines BLm and BLm+1 and the word line WL0 may be referred to as second memory cells. The first memory cells Cell 1 may belong to the main area M of FIG. 1, whereas the second memory cells Cell 2 may belong to the spare area S of FIG. 1.

The memory cells of the spare area S of FIG. 1 may all be second memory cells Cell 2. Also, of the memory cells of the spare area S of FIG. 1, only particular memory cells for storing information about a defective block of the main area M may be second memory cells Cell 2 and the other memory cells may be the first memory cells Cell 1. That is, the spare area S of FIG. 1 may include at least one second memory cell Cell 2. The information about a defective block indicating whether the block is defective may be indicated through the at least one second memory cell Cell 2.

The first memory cell Cell 1 that is connected to the bit line BLm−2 and the word line WL0 may include a transistor Tr and a phase-change resistor R. The phase-change resistor R is connected to the bit line BLM−2 and a first terminal of the transistor Tr. The transistor Tr opens/closes between the first terminal and a second terminal in response to a signal provided through the word line WL0. The first terminal of the transistor Tr is connected to the phase-change resistor R, and the second terminal thereof is grounded.

To determine a bit value stored in the first memory cell Cell 1, the transistor Tr is activated and the phase-change resistor R is grounded. Then, by applying a predetermined voltage or current via the bit line BLm−2, a resistance of the phase-change resistor R may be determined. For example, when the resistance of the phase-change resistor R is less than a predetermined value, logic "0" may be read out. When the resistance of the phase-change resistor R is greater than the predetermined value, logic "1" may be read out.

It is obvious that the logic value according to the resistance of the phase-change resistor R may be freely determined. In the following example, it is assumed that a logic value is "0" when the resistance of the phase-change resistor R is less than a predetermined value and a logic value is "1" when the resistance of the phase-change resistor R is greater than the predetermined value.

The second memory cell Cell 2 connected to the bit line BLm and the word line WL0 may include a transistor Tr, a phase-change resistor R, and a fuse F. While the transistor Tr and the phase-change resistor R are arranged in the same manner as in the first memory cell Cell 1, the difference is that the fuse F is arranged between the transistor Tr and the phase-change resistor R. The fuse F cuts off the circuit of the second memory cell Cell 2. The fuse F signifies a device that is initially short-circuited but opened by an electromagnetic wave or high current.

When the fuse F is open, even if the transistor Tr is activated, high-impedance is always present between ground and the bit line BLm regardless of the resistance of the phase-change resistor R. That is, in this case, logic "1" may be read out. In the present specification, the high-impedance denotes a state in which a gap between two terminals is electrically open.

Although it is not illustrated in FIG. 3A, alternatively, an anti-fuse (not shown) may be used instead as the fuse F. The anti-fuse is a device that is initially open and short-circuited by an electromagnetic wave or heat. The anti-fuse may be connected parallel to the phase-change resistor R. When the anti-fuse is short-circuited, the resistance between the opposite terminals of the phase-change resistor R always has a low-impedance by the short-circuited anti-fuse regardless of the state of the phase-change resistor R. Thus, when the anti-fuse is short-circuited, logic "0" is always read out from the memory cell to which the anti-fuse is connected. In the present specification, the low-impedance between two terminals denotes a state in which the two terminals are electrically short-circuited.

Although the memory cell Cell 2 connected to the bit line BLm+1 and the word line WL0 is illustrated as a second memory cell having a fuse F in FIG. 3A, if only the memory cell connected to the bit line BLm and the word line WL0 indicates information about a defective block, the memory cell Cell 2 connected to the bit line BLm+1 and the word line WL0 may be a first memory cell without a fuse F.

Figure 3B:
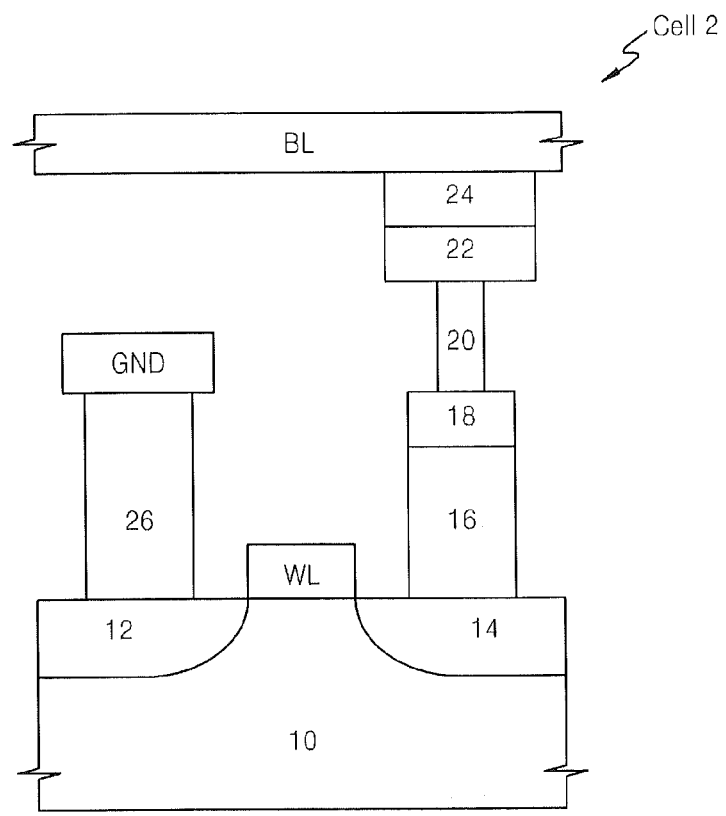
FIG. 3B is a cross-sectional view schematically illustrating a structure of a second memory cell Cell 2 of FIG. 3A.

FIG. 3B is a cross-sectional view schematically illustrating a structure of a second memory cell Cell 2 of FIG. 3A. Referring to FIG. 3B, a word line WL may be arranged partially on a substrate 10. Although it is not illustrated in FIG. 3B, a gate insulation layer is arranged between the word line WL and the substrate 10. The substrate 10 may be a semiconductor substrate or a dielectric substrate. The substrate 10 may include at least one of a silicon substrate, a germanium substrate, and an SOI substrate.

Impurity regions 12 and 14 may be formed in the substrate 10 at both lateral sides of the word line WL. The conductive types of the impurity regions 12 and 14 may be different from that of the substrate 10. For example, the conductive type of the substrate 10 may be a p-type, and the conductive types of the impurity regions 12 and 14 may be n-types. The substrate 10, the word line WL, and the impurity regions 12 and 14 may constitute the transistor Tr of FIG. 3A.

A contact plug 16 and a lower electrode 20 may be arranged above the impurity region 14. A fuse layer 18 may be arranged between the contact plug 16 and the lower electrode 20. The fuse layer 18 initially short-circuits between the contact plug 16 and the lower electrode 20. However, when an electromagnetic wave is irradiated, the fuse layer 18 may open electrical connection between the contact plug 16 and the lower electrode 20. According to another example, the fuse layer 18 may open the electrical connection between the contact plug 16 and the lower electrode 20 by over-current. The fuse layer 18 opened by an electromagnetic wave is not short-circuited again even if an infrared reflow process is performed. Thus, the fuse layer 18 may be used as a kind of one-time program cell.

Although FIG. 3B illustrates that the fuse layer 18 is arranged between the contact plug 16 and the lower electrode 20, the fuse layer 18 may be arranged between the contact plug 16 and the impurity region 14.

A phase-change material layer 22 may be arranged on the lower electrode 20. The lower electrode 20 may be a device to heat the phase-change material layer 22. The lower electrode 20 may include at least one metal nitride, metal, metal oxynitride, silicide, and conductive carbon. In detail, the lower electrode 20 may include at least one of Ti, Ta, Mo, W, TiN, TaN, WN, MoN, NbN, TiSiN, TiAlN, TiBN, ZrSiN, WSiN, WBN, ZrAlN, MoSiN, TaSiN, TaAlN, TiW, TiSi, TaSi, TiON, TiAlON, WON, and TaON. The size of a cross-section of the lower electrode 20 may be smaller than that of the phase-change material layer 22. A decrease in the cross-section of the lower electrode 20 may decrease a contact area and increase a contact resistance. As the contact resistance increases, the lower electrode 20 may be increased to a high temperature at a lower power.

The phase-change material layer 22 may include at least one of Ge—Sb—Te, Sb—Te, As—Sb—Te, and Sb—Se. In detail, the phase-change material layer 22 may be Ge2Sb2Te5. The phase-change material layer 22 may include at least one of an As—Sb—Te-metal compound, an As—Ge—Sb—Te-metal compound, a metal-Sb—Te-metal compound, a Group 5A element-Sb—Te-metal compound, a Group 6A element-Sb—Te-metal compound, a Group 5A element-Sb—Se-metal compound, and a Group 6A-Sb—Se-metal compound. The composition ratio of the compounds may diversely vary. In detail, the Group 5A element may be nitrogen (N) or phosphorus (P). The Group 6A element may be oxygen (O) or sulfur (S). As the phase-change material layer 22 is heated by the lower electrode 20, the phase-change material layer 22 may be phase-changed.

In another example, the phase-change material layer 22 may include at least one of In—Sb—Te, a Group 5A element-In—Sb—Te compound, and a Group 6A element-In—Sb—Te compound. In this case, a crystallization temperature of the phase-change material layer 22 may be over 300° C.

An upper electrode 24 may be arranged on the phase-change material layer 22. The upper electrode 24 may include the same material as the lower electrode 16. The upper electrode 24 is electrically connected to a bit line BL, as illustrated in FIG. 3B. The impurity region 12 may be electrically connected to ground GND via a ground contact 26. An empty space above the substrate 10 may be filled with an insulation material (not shown).

Figure 3C:
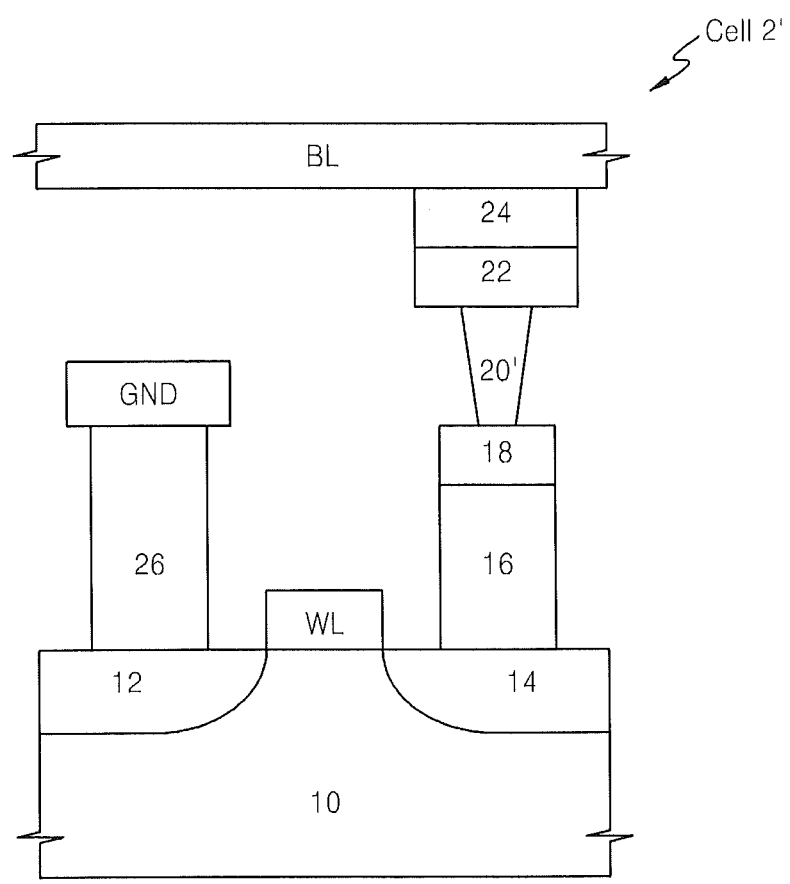
FIG. 3C is a cross-sectional view schematically illustrating a modified structure of the second memory cell Cell 2 of FIG. 3A.

FIG. 3C is a cross-sectional view schematically illustrating a modified structure of the second memory cell Cell 2 of FIG. 3A. Referring to FIG. 3C, a second memory cell Cell 2' is substantially the same as the second memory cell Cell 2 of FIG. 3B, except for a lower electrode 20'. As illustrated in FIG. 3C, the lower electrode 20' has a cross-section of a trapezoid having a lower side shorter than an upper side. That is, a contact area between the lower electrode 20' and the fuse layer 18 may be smaller than a contact area between the lower electrode 20' and the phase-change material layer 22.

When the contact area decreases, the contact resistance increases. As a result, higher heat is generated between the lower electrode 20' and the fuse layer 18 than between the lower electrode 20' and the phase-change material layer 22. Thus, the temperature of the fuse layer 18 may be increased higher than that of the phase-change material layer 22.

The fuse layer 18 may be opened by the temperature applied to the fuse layer 18. The temperature may be higher than the temperature of an infrared reflow process. Thus, the fuse layer 18 will not be opened by the infrared reflow process.

Figure 4A:
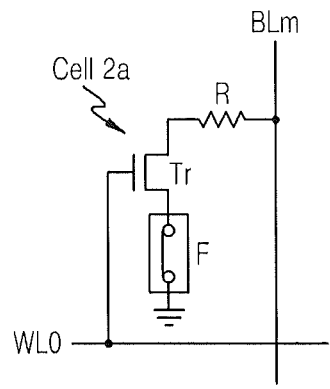
FIG. 4A is a circuit diagram of a memory cell of a non-volatile memory device including a phase-change material, according to another exemplary embodiment of the present inventive concept.

FIG. 4A is a circuit diagram of a memory cell of a non-volatile memory device including a phase-change material, according to another exemplary embodiment of the present inventive concept. FIG. 4A illustrates the second memory cell Cell 2a of the spare area S. The second memory cell Cell 2a of FIG. 4A is substantially the same as the second memory cell Cell 2 connected to the bit line BLm and the word line WL0 of FIG. 3A, except for the location of the fuse F.

Referring to FIG. 4A, the second memory cell Cell 2a may include the phase-change resistor R connected to the bit line BLm, the transistor Tr connected to the phase-change resistor R and controlled by a signal provided through the word line WL0, and the fuse F connected between the transistor Tr and the ground GND.

The fuse F cuts off the circuit of the second memory cell Cell 2a. The fuse F initially connects the transistor Tr and the ground GND. However, when an electromagnetic wave is irradiated or a high current is applied to the fuse F, the fuse F opens the electrical connection between the transistor Tr and the ground GND. Accordingly, when the fuse F is open, high-impedance may be generated between the bit line BLm and the ground GND. The high-impedance does not vary according to the state of the phase-change resistor R so that the data value stored in the second memory cell Cell 2a may not be changed even in a high temperature environment such as a reflow process.

Figure 4B:
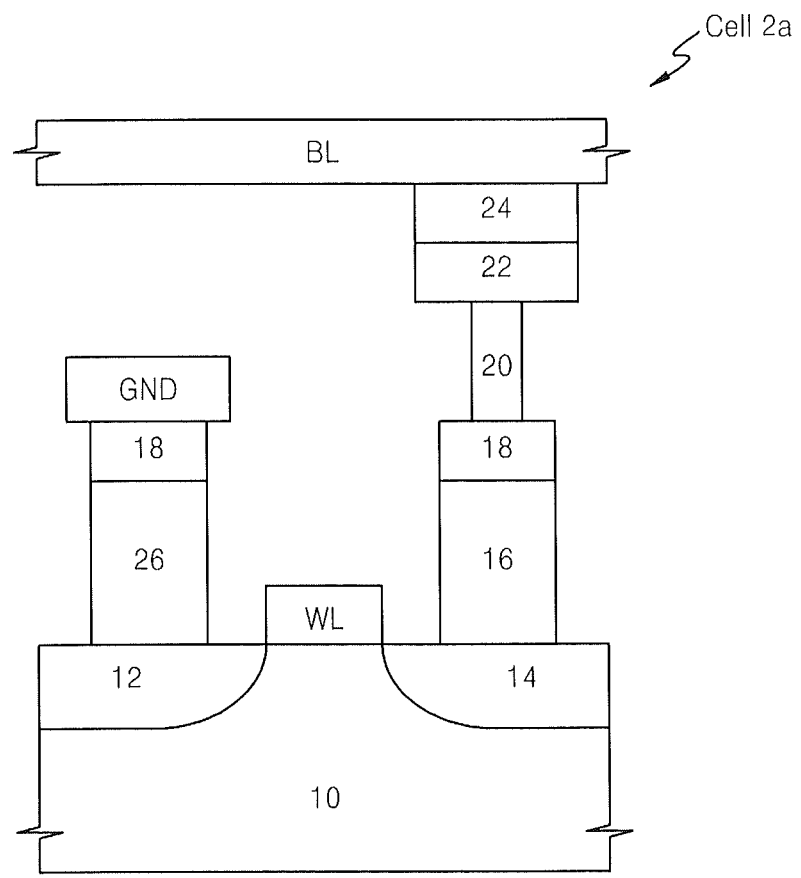
FIG. 4B is a cross-sectional view schematically illustrating a structure of a second memory cell Cell 2a of FIG. 4A.

FIG. 4B is a cross-sectional view schematically illustrating a structure of the second memory cell Cell 2a of FIG. 4A. Referring to FIG. 4B, the second memory cell Cell 2a is substantially the same as the second memory cell Cell 2 of FIG. 3B, except for the location of the fuse layer 18. As illustrated in FIG. 4B, the fuse layer 18 may be arranged between a ground contact 26 and the ground GND. When an electromagnetic wave is irradiated toward the fuse layer 18, the electrical connection between the ground contact 26 and the ground GND may be opened.

In another example, the fuse layer 18 may be arranged between the ground contact 26 and the impurity region 12.

Figure 5A:
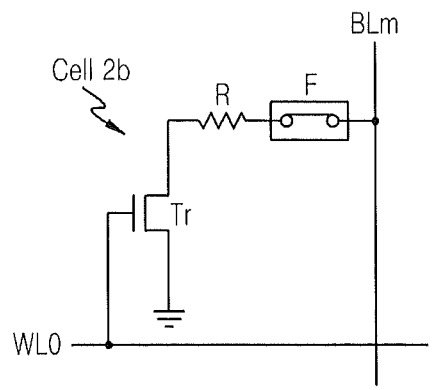
FIG. 5A is a circuit diagram of a memory cell of a non-volatile memory device including a phase-change material, according to another exemplary embodiment of the present inventive concept.

FIG. 5A is a circuit diagram of a memory cell of a non-volatile memory device including a phase-change material, according to another exemplary embodiment of the present inventive concept. FIG. 5A illustrates a second memory cell Cell 2b. Referring to FIG. 5A, the second memory cell Cell 2b is substantially the same as the second memory cell Cell 2 of FIG. 3A connected to the bit line BLm and the word line WL0, except for the location of the fuse F.

As illustrated in FIG. 5A, the second memory cell Cell 2a may include the fuse F connected to the bit line BLm, the phase-change resistor R connected to the fuse F, and the transistor Tr connected between the phase-change resistor R and the ground GND and controlled by a signal provided via the word line WL0.

Figure 5B:
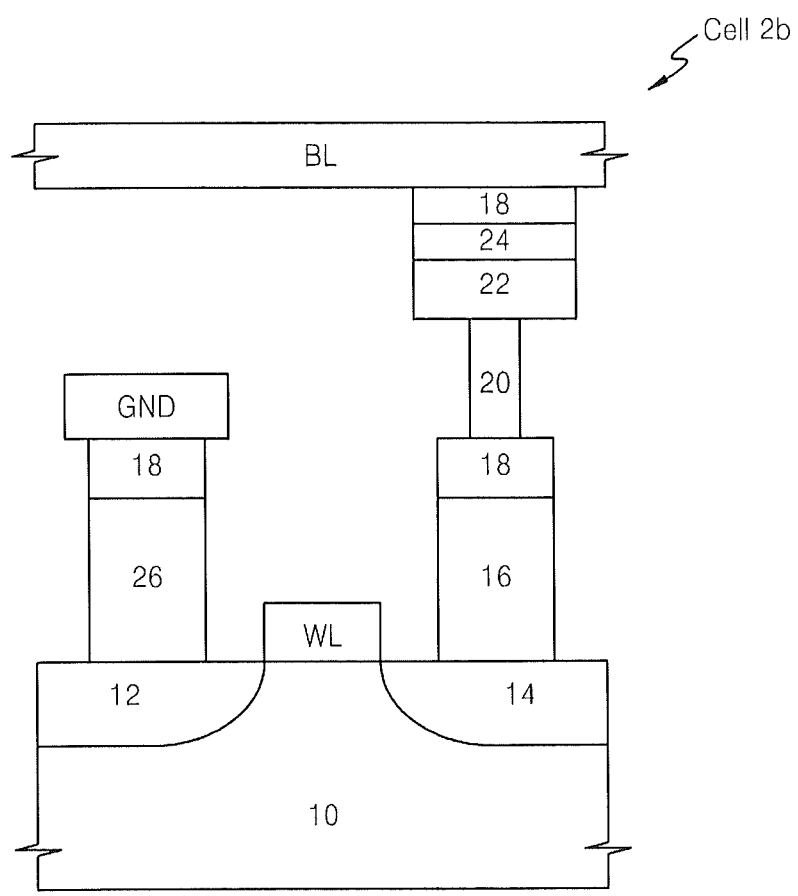
FIG. 5B is a cross-sectional view schematically illustrating a structure of a second memory cell Cell 2b of FIG. 5A.

The fuse F cuts off the circuit of the second memory cell Cell 2b. The fuse F initially connects the bit line BLm and the phase-change resistor R. However, when an electromagnetic wave is irradiated or a high current is applied to the fuse F, the fuse F opens the electrical connection between the bit line BLm and the phase-change resistor R. Accordingly, when the fuse F is open, high-impedance may be generated between the bit line BLm and the ground GND. The high-impedance does not vary according to the state of the phase-change resistor R so that the data value stored in the second memory cell Cell 2b may not be changed even in a high temperature environment such as a reflow process, FIG. 5B is a cross-sectional view schematically illustrating a structure of the second memory cell Cell 2b of FIG. 5A. Referring to FIG. 5B, the second memory cell Cell 2b is substantially the same as the second memory cell Cell 2 of FIG. 3B, except for the location of the fuse layer 18. As illustrated in FIG. 5B, the fuse layer 18 may be arranged between the bit line BL and the upper electrode 24. The fuse layer 18 initially connects the bit line BL and the upper electrode 24, However, when an electromagnetic wave is irradiated toward the fuse layer 18, the fuse layer 18 opens the electrical connection between the bit line BL and the upper electrode 24.

Figure 6:
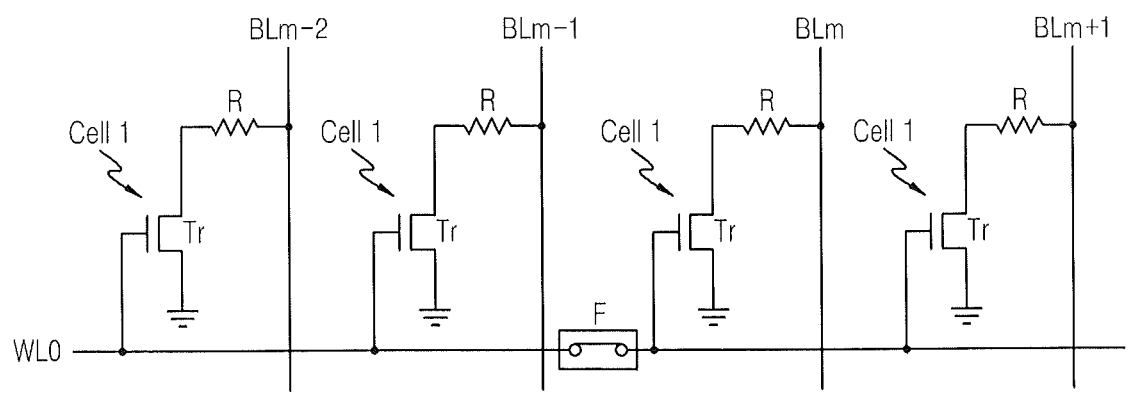
FIG. 6 is a circuit diagram of memory cells forming a part of a non-volatile memory device including a phase-change material, according to another exemplary embodiment of the present inventive concept.

FIG. 6 is a circuit diagram of memory cells forming a part of a non-volatile memory device including a phase-change material, according to another exemplary embodiment of the present inventive concept. FIG. 6 illustrates one word line WL0 and four bit lines BLm−2 to BLm+1. Unlike the circuit diagram of FIG. 3A, the memory cells connected to the bit lines BLm−2 to BLm+1 and the word line WL0 are all first memory cells Cell 1 that do not include the fuse F. However, like the circuit diagram of FIG. 3A, the memory cells connected to the bit lines BLm−2 and BLm−1 and the word line WL0 belong to the main area M of FIG. 1 and the memory cells connected to the bit lines BLm and BLm+1 and the word line WL0 belong to the spare area S of FIG. 1.

As illustrated in FIG. 6, the fuse F is arranged in the middle of the word line WL0. The fuse F initially connects the word line WL0. However, when an electromagnetic wave is irradiated or a high current is applied to the fuse F, the fuse F opens the word line WL0 so that the word line WL0 connected to the memory cells of the spare area S may be floated. Accordingly, the transistors Tr included in the memory cells of the spare area S may not be activated. As a result, the phase-change resistor R is electrically opened from the ground GND. Thus, high-impedance is generated between the bit lines BLm and BLm+1 and the ground GND, A logic value corresponding to the high-impedance may be permanently stored in the memory cells connected to the bit lines BLm−2 and BLm−1 and the ground GND.

Figure 7A:
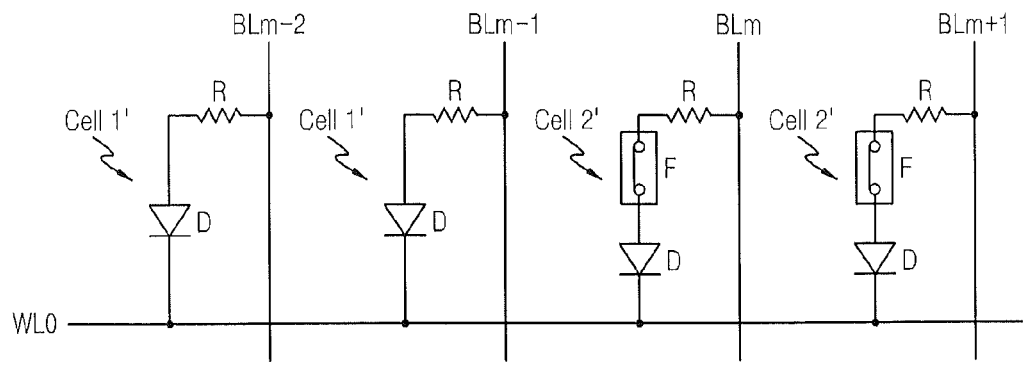
FIG. 7A is a circuit diagram of memory cells forming a part of a non-volatile memory device including a phase-change material, according to another exemplary embodiment of the present inventive concept.

FIG. 7A is a circuit diagram of memory cells forming a part of a non-volatile memory device including a phase-change material, according to another exemplary embodiment of the present inventive concept, FIG. 7A illustrates one word line WL0 and four bit lines BLm−2 to BLm+1. Referring to FIG. 7A, memory cells Cell 1' connected to the bit lines BLm−2 and BLm−1 and the word line WL0 may be referred to as first memory cells, and memory cells Cell 2' connected to the bit lines BLm and BLm+1 and the word line WL0 may be referred to as second memory cells. As in the circuit diagram of FIG. 3A, the first memory cell Cell 1' may belong to the main area M of FIG. 1 and the second memory cell Cell 2' may belong to the spare area S of FIG. 1.

The memory cells of the spare area S of FIG. 1 may all be second memory cells Cell 2'. Also, among the memory cells of the spare area S of FIG. 1, only particular memory cells for storing the information about a defective block of the main area M may be the second memory cells Cell 2' and the other memory cells may be the first memory cells Cell 1'.

The first memory cell Cell 1' connected to the bit line BLm−2 and the word line WL0 includes a diode D and the phase-change resistor R. The phase-change resistor R is connected between the bit line BLm−2 and the diode D. The phase-change resistor R may be connected to an anode of the diode D, whereas the word line WL0 may be connected to a cathode of the diode D.

To determine the bit value stored in the first memory cell Cell 1', a voltage of the bit line BLm−2 is set to be higher than that of the word line WL0 so that the diode D is activated. Accordingly, resistance of the phase-change resistor R may be obtained. If the resistance of the phase-change resistor R is less than a predetermined value, logic "0" may be read out. If the resistance of the phase-change resistor R is greater than the predetermined value, logic "1" may be read out.

The second memory cell Cell 2 connected to the bit line BLm and the word line WL0 may include a diode D, a phase-change resistor R, and a fuse F. The arrangement of the diode D and the phase-change resistor R is the same as the first memory cell Cell 1', except that the fuse F is arranged between the diode D and the phase-change resistor R. The fuse F cuts off the circuit of the second memory cell 2' and is initially short-circuited but opened by an electromagnetic wave or a high current.

When the fuse F is open, high-impedance is generated between the bit line BLm and the word line WL0 regardless of the resistance of the phase-change resistor R. That is, in this case, logic "1" may be read out.

Figure 7B:
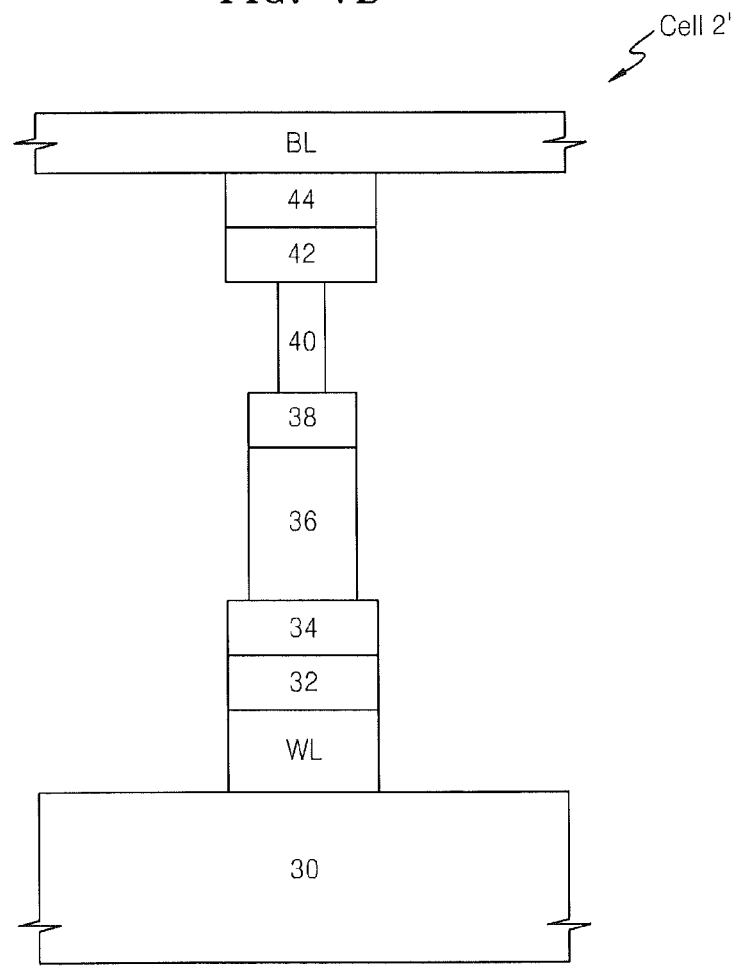
FIG. 7B is a cross-sectional view schematically illustrating a structure of a second memory cell Cell 2' of FIG. 7A.

FIG. 7B is a cross-sectional view schematically illustrating a structure of the second memory cell Cell 2' of FIG. 7A. Referring to FIG. 7B, the word line WL may be arranged on the substrate 30. An n-type semiconductor layer 32 and a p-type semiconductor layer 34 may be arranged above a word line WL. The n-type semiconductor layer 32 and a p-type semiconductor layer 34 may form the diode D of FIG. 7A.

A contact plug 36, a fuse layer 38, a lower electrode 40, a phase-change material layer 42, and an upper electrode 44 may be sequentially arranged above the p-type semiconductor layer 34. The upper electrode 44 may be electrically connected to the bit line BL. The contact plug 36, the fuse layer 38, the lower electrode 40, the phase-change material layer 42, and the upper electrode 44 may be substantially the same as the contact plug 16, the fuse layer 18, the lower electrode 20, the phase-change material layer 22, and the upper electrode 24 of FIG. 3B, respectively.

As described with reference to FIG. 3B, the fuse layer 38 may initially short-circuit the contact plug 36 and the lower electrode 40, but may open the electrical connection between the contact plug 36 and the lower electrode 40 when an electromagnetic wave is irradiated. The fuse layer 38 opened by the electromagnetic wave is not short-circuited again even when an infrared reflow process is performed, Thus, the fuse layer 38 may be used as a kind of one-time program cell, According to another example, the fuse layer 38 may open the electrical connection between the contact plug 36 and the lower electrode 40 by over-current.

Figure 7C:
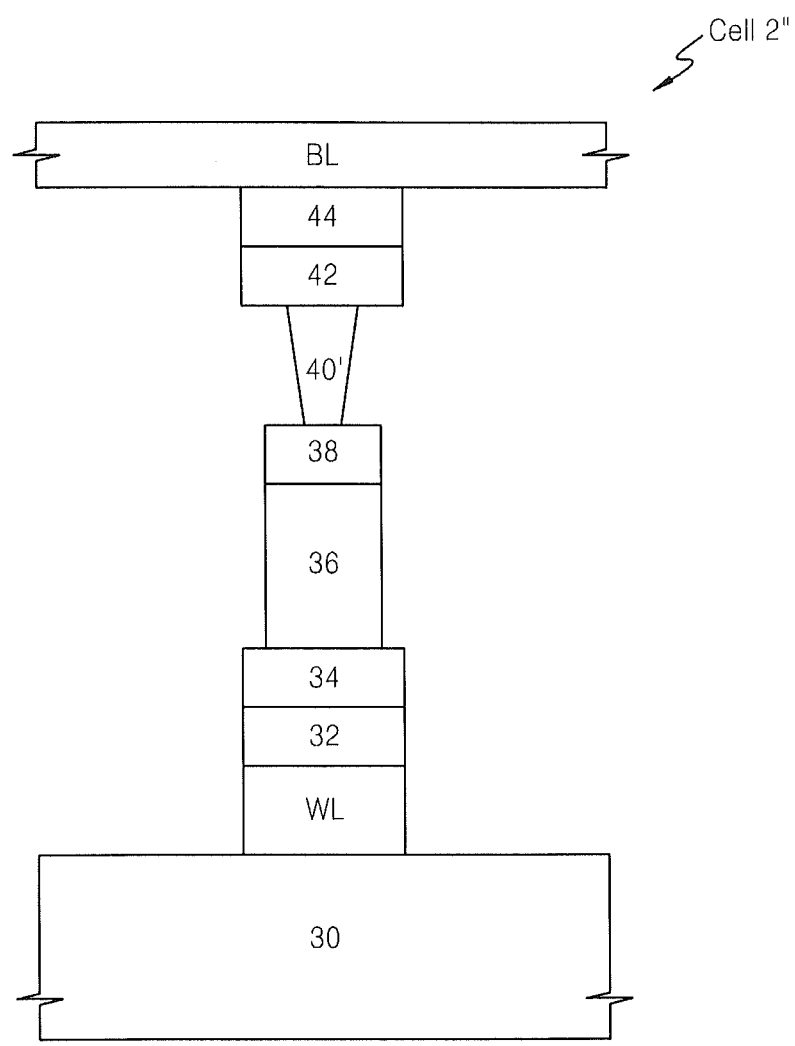
FIG. 7C is a cross-sectional view schematically illustrating a modified structure of the second memory cell Cell 2' of FIG. 7A.

FIG. 7C is a cross-sectional view schematically illustrating a modified structure of the second memory cell Cell 2' of FIG. 7A. Referring to FIG. 7C, a second memory cell Cell 2" is substantially the same as the second memory cell 2' of FIG. 7B, except for a lower electrode 40', As illustrated in FIG. 7C, the lower electrode 40' has a cross-section of a trapezoid having a lower side shorter than an upper side. That is, a contact area between the lower electrode 40' and the fuse layer 38 may be smaller than the contact area between the lower electrode 40' and the phase-change material layer 42.

When the contact area decreases, the contact resistance increases. As a result, higher heat is generated between the lower electrode 40' and the fuse layer 38 than between the lower electrode 40' and the phase-change material layer 42, Thus, the temperature of the fuse layer 38 may be increased higher than that of the phase-change material layer 42.

The fuse layer 38 may be opened by the temperature applied to the fuse layer 38. The temperature may be higher than the temperature of the infrared reflow process. Thus, the fuse layer 38 will not be opened by the infrared reflow process.

Figure 8A:
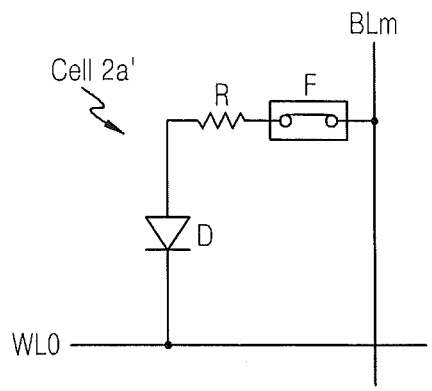
FIG. 8A is a circuit diagram of memory cells forming a part of a non-volatile memory device including a phase-change material, according to another exemplary embodiment of the present inventive concept.

FIG. 8A is a circuit diagram of memory cells forming a part of a non-volatile memory device including a phase-change material, according to another exemplary embodiment of the present inventive concept. FIG. 8A illustrates a second memory cell Cell 2a' included in the spare area S. Referring to FIG. 8A, the second memory cell Cell 2a' is substantially the same as the second memory cell Cell 2' of FIG. 7A, which is connected to the bit line BLm and the word line WL0, except for the location of the fuse F.

As illustrated in FIG. 8A, the second memory cell Cell 2a' may include the fuse F connected to the bit line BLm, the phase-change resistor R connected to the fuse F, and the diode D connected between the phase-change resistor R and the word line WL0. The fuse F cuts off the circuit of the second memory cell Cell 2a'. The fuse F initially connects the bit line BLm and the phase-change resistor R. However, when an electromagnetic wave is irradiated or a high current is applied to the fuse F, the fuse F opens the electrical connection between the bit line BLm and the phase-change resistor R. Accordingly, when the fuse F is open, high-impedance may be generated between the bit line BLm and the word line WL0. The high-impedance does not vary according to the state of the phase-change resistor R so that the data value stored in the second memory cell Cell 2a' may not be changed even in a high temperature environment such as a reflow process.

Figure 8B:
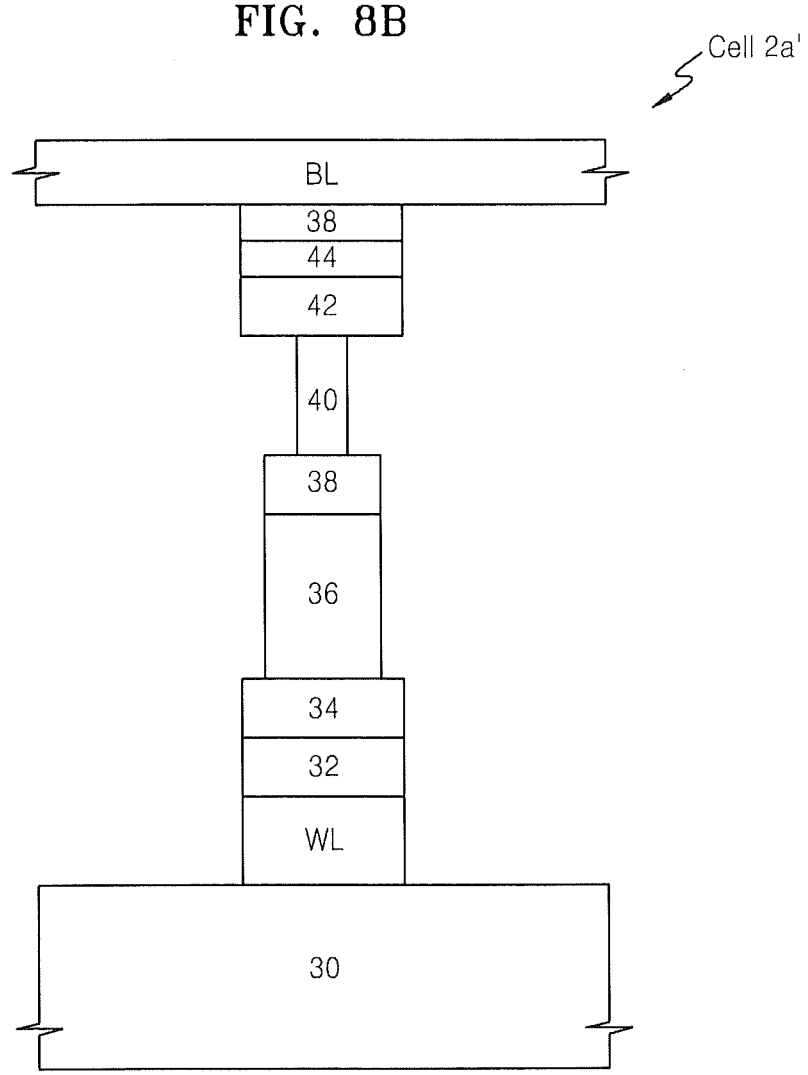
FIG. 8B is a cross-sectional view schematically illustrating a structure of a second memory cell Cell 2a' of FIG. 8A.

FIG. 8B is a cross-sectional view schematically illustrating a structure of the second memory cell Cell 2a' of FIG. 8A. Referring to FIG. FIG. 8B, the second memory cell Cell 2a' is substantially the same as the second memory cell Cell 2' of FIG. 7B, except for the location of the fuse layer 38. As illustrated in FIG. 8B, the fuse layer 38 may be arranged between the bit line BL and the upper electrode 44. The fuse layer 38 initially connects the bit line BL and the upper electrode 44. However, when an electromagnetic wave is irradiated toward the fuse layer 38, the fuse layer 38 opens the electrical connection between the bit line BL and the upper electrode 44.

In another example, the fuse layer 38 may be arranged between the upper electrode 44 and the phase-change material layer 42.

Figure 9:
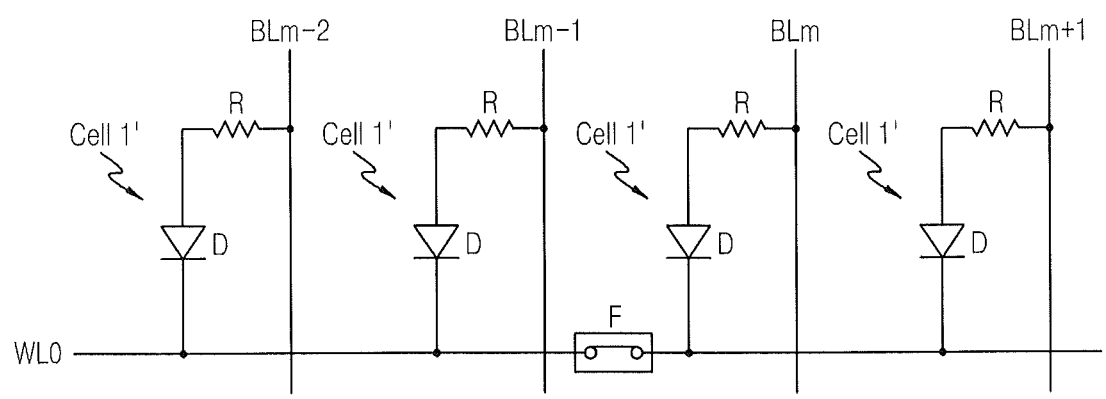
FIG. 9 is a circuit diagram of memory cells forming a part of a non-volatile memory device including a phase-change material, according to another exemplary embodiment of the present inventive concept.

FIG. 9 is a circuit diagram of memory cells forming a part of a non-volatile memory device including a phase-change material, according to another exemplary embodiment of the present inventive concept. FIG. 9 illustrates one word line WL0 and four bit lines BLm−2 to BLm+1. Unlike the circuit diagram of FIG. 7A, the memory cells connected to the bit lines BLm−2 to BLm+1 and the word line WL0 are all first memory cells Cell 1' that do not include the fuse F. However, like the circuit diagram of FIG. 7A, the memory cells connected to the bit lines BLm−2 and BLm−1 and the word line WL0 belong to the main area M of FIG. 1 and the memory cells connected to the bit lines BLm and BLm+1 and the word line WL0 belong to the spare area S of FIG. 1.

As illustrated in FIG. 9, the fuse F is arranged in the middle of the word line WL0. The fuse F initially connects the word line WL0. However, when an electromagnetic wave is irradiated or a high current is applied to the fuse F, the fuse F opens the word line WL0 so that the word line WL0 connected to the memory cells of the spare area S may be floated. Accordingly, the diodes D of the memory cells of the spare area S may not be conductive. As a result, high-impedance is generated between the bit lines BLm and BLm+1 and the ground GND. Thus, a logic value corresponding to the high-impedance may be permanently stored in the memory cells connected to the bit lines BLm−2 and BLm−1 and the ground GND.

Figure 10:
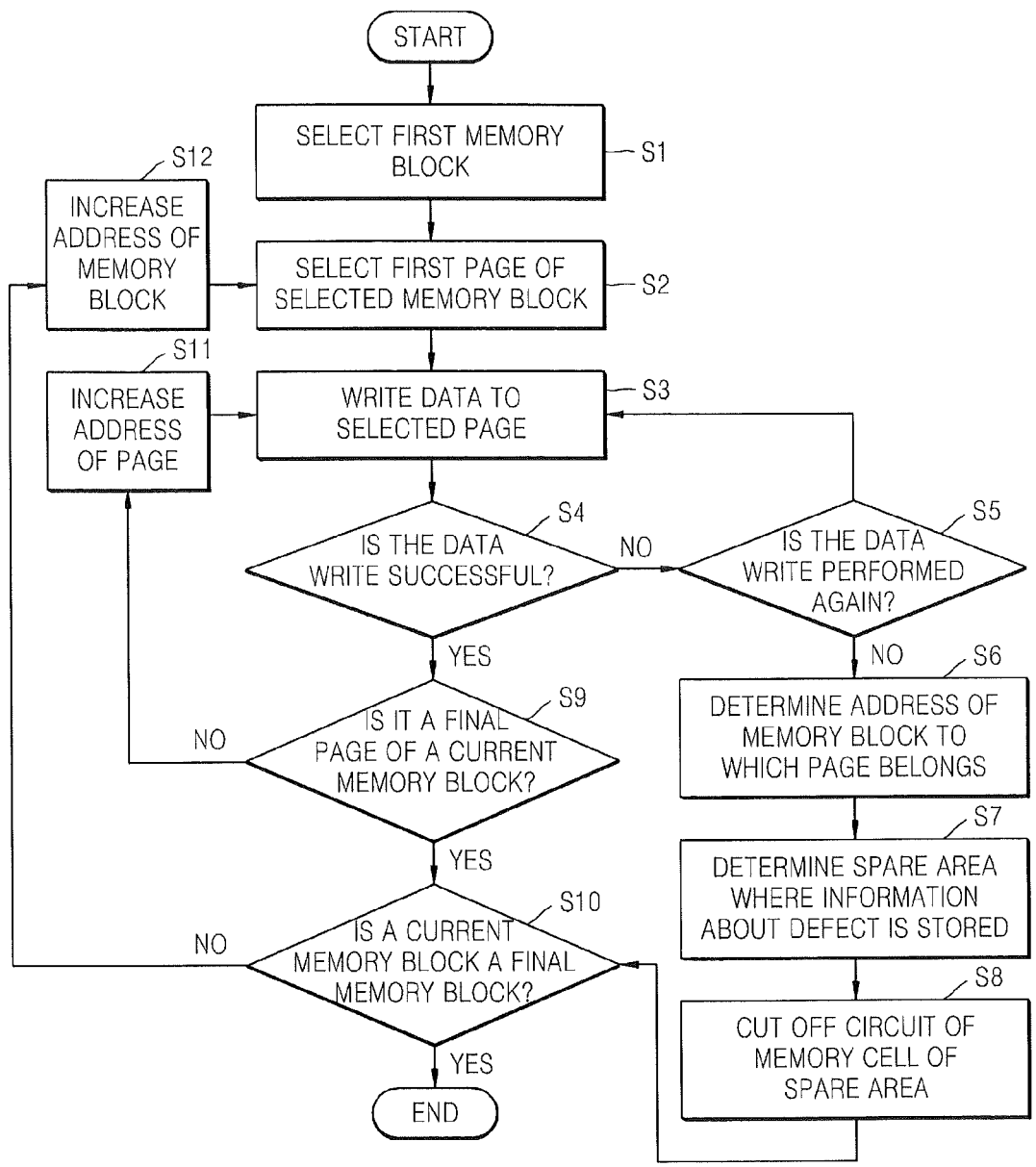
FIG. 10 is a flowchart for explaining a method of testing a non-volatile memory device, according to an exemplary embodiment of the present inventive concept.

FIG. 10 is a flowchart for explaining a method of testing a non-volatile memory device, according to an exemplary embodiment of the present inventive concept. As described above, a non-volatile memory device may include a plurality of memory blocks and one memory block may include a plurality of pages. Also, the memory block and the page may be divided into a main area and a spare area.

Referring to FIG. 10, to test a non-volatile memory device, a first memory block is selected (S1). A first page of the first memory block is selected (S2). Data is written to the selected first page (S3). It is determined whether data write is successful (S4).

If the data write fails, it is determined whether to repeat the data write (S5). In operation S5, it may also be determined whether the data write is repeated by a predetermined number of times. If it is determined to repeat the data write, operation S3 is repeated to write the data again.

However, if the data write has already been repeated by the predetermined number of times, the data write is performed no longer and an address of a memory block to which a current page belongs is recognized (S6). The spare area S in the memory block for recording information about a defect is determined (S7). The circuit of a memory cell of the recognized spare area S for recording information about a defect is cut off (S8). In order to cut off the circuit of the memory cell, the memory cell may have the circuit structures of the second memory cells described above with reference to FIGS. 3A to 9. For example, in order to cut off the circuit of the memory cell, an electromagnetic wave may be irradiated to open the fuse of the memory cell.

Then, it is determined whether a current block is a final memory block (S10). That is, if any one page of a current memory block is determined to be defective, the entire memory block is determined as being defective so that it is not necessary to perform the data write test for the remaining pages.

Otherwise, if the data write is determined to be successful in operation S4, it is determined whether a current page of a current memory block is a final page (S9). If it is determined that the current page of a current memory block is not a final page, a page address increases (S11). Accordingly, in operation S3, data write is performed on the next page.

Otherwise, if the current page is determined to be a final page in operation S9, it is determined whether the current memory block is a final memory block (S10). If the current memory block is determined to be a final memory block, the test is completed. Otherwise, a memory block address increases (S12) so that the data write is performed on the next memory block.

In the non-volatile memory device tested by the method described with reference to FIG. 10, initial information such as information about a defective block is permanently recorded in the spare area. A non-volatile memory module may be fabricated using the non-volatile memory device. To fabricate a non-volatile memory module, a reflow process is performed by arranging the non-volatile memory device on a substrate, and thus, the non-volatile memory device may be fixed on the substrate. The non-volatile memory device is exposed to a high temperature environment in the reflow process. However, as described above, the circuit of the memory cell in the spare area is cut off to permanently have a particular logic value read. Thus, the logic value is not changed even when the non-volatile memory device is exposed to the high temperature environment, In the fabrication of a non-volatile memory device, a defective block may be determined by reading the memory cells of the spare area that have a circuit cut off, While the inventive concept has been particularly shown and described with reference to exemplary embodiments thereof, it will be understood that various changes in form and details may be made therein without departing from the spirit and scope of the following claims.

What is claimed is:

1. A non-volatile memory device, comprising:
a plurality of memory blocks, each comprising:
a main area including a plurality of first memory cells having a phase-change material; and
a spare area including at least one second memory cell for storing initial information about the plurality of first memory cells,
wherein a circuit of the at least one second memory cell is cut off according to the initial information, and the initial information is defective block information that is information about a defect of the plurality of memory blocks, and
wherein the at least one second memory cell comprises:
a phase-change element connected to a bit line;
a switching element opening and closing a connection between the phase-change element and ground according to a signal applied via a word line; and
a fuse layer that is opened by an electromagnetic wave, and
wherein the fuse layer is arranged between the bit line and the phase-change element, between the phase-change element and the switching element, or between the switching element and the ground.

2. The non-volatile memory device of claim 1, wherein, in a read operation, the at least one second memory cell is unchangedly read as the same logic value.

3. The non-volatile memory device of claim 1, wherein the at least one second memory cell is provided in plural, each second memory cell comprises a phase-change element connected to a bit line and a transistor element that opens and closes a connection between the phase-change element and ground according to a signal applied via a word line, and the word line that is commonly connected to gates of the plurality of transistor elements is floated by cutting when a block including the plurality of second memory cells is defective.

4. The non-volatile memory device of claim 1, wherein the at least one second memory cell comprises a phase-change element and a diode element serially connected between a bit line and a word line, and a fuse layer that is opened by an electromagnetic wave and arranged between the bit line and the phase-change element or between the phase-change element and the diode element.

5. The non-volatile memory device of claim 1, wherein the at least one second memory cell is provided in plural, each second memory cell comprises a phase-change element and a diode element that are serially connected to a bit line and a word line, and the word line that is commonly connected to gates of the plurality of diode elements is floated by cutting when a block including the plurality of second memory cells is defective.

6. The non-volatile memory device of claim 1, wherein the at least one second memory cell comprises:
    a contact plug arranged on a substrate;
    a fuse layer arranged on the contact plug;
    a lower electrode arranged on the fuse layer;
    a phase-change material layer arranged on the lower electrode; and
    an upper electrode arranged on the phase-change material layer.

7. The non-volatile memory device of claim 6, wherein the lower electrode has a cross-section of a trapezoid having a lower side shorter than an upper side.

8. The non-volatile memory device of claim 1, wherein the at least one second memory cell comprises:
    a ground contact plug arranged on a substrate; and
    a fuse layer arranged on the ground contact plug,
    wherein the ground contact plug is connected to ground via the fuse layer.

9. The non-volatile memory device of claim 1, wherein the at least one second memory cell comprises:
    a contact plug arranged on a substrate;
    a lower electrode arranged on the contact plug;
    a phase-change material layer arranged on the lower electrode;
    an upper electrode arranged on the phase-change material layer; and
    a fuse layer arranged on the upper electrode.

10. The non-volatile memory device of claim 1, wherein the at least one second memory cell comprises:
    a word line arranged on a substrate;
    an n-type semiconductor layer arranged on the word line;
    a p-type semiconductor layer arranged on the n-type semiconductor layer;
    a contact plug arranged on the p-type semiconductor layer;
    a fuse layer arranged on the contact plug;
    a lower electrode arranged on the fuse layer;
    a phase-change material layer arranged on the lower electrode; and
    an upper electrode arranged on the phase-change material layer.

11. The non-volatile memory device of claim 1, wherein the at least one second memory cell comprises:
    a word line arranged on a substrate;
    an n-type semiconductor layer arranged on the word line;
    a p-type semiconductor layer arranged on the n-type semiconductor layer;
    a contact plug arranged on the p-type semiconductor layer;
    a lower electrode arranged on the contact plug;
    a phase-change material layer arranged on the lower electrode;
    an upper electrode arranged on the phase-change material layer; and
    a fuse layer arranged on the upper electrode.

* * * * *